United States Patent [19]

Acovic et al.

[11] Patent Number: 5,411,905
[45] Date of Patent: May 2, 1995

[54] METHOD OF MAKING TRENCH EEPROM STRUCTURE ON SOI WITH DUAL CHANNELS

[75] Inventors: Alexandre Acovic, Mohegan Lake; Ben S. Wu, Yorktown Heights, both of N.Y.

[73] Assignee: International Business Machines Corporation, Armonk, N.Y.

[21] Appl. No.: 236,752

[22] Filed: Apr. 29, 1994

[51] Int. Cl.[6] ............................................... H01L 21/8247
[52] U.S. Cl. ..................................... 437/43; 437/21; 437/52; 437/203
[58] Field of Search ...................... 437/21, 43, 48, 52, 437/203

[56] References Cited

U.S. PATENT DOCUMENTS

| | | | |
|---|---|---|---|
| H0948 | 8/1991 | Akulfi | 437/21 |
| 4,975,383 | 12/1990 | Baglee | 437/203 |
| 5,045,490 | 9/1991 | Esquivel et al. | 437/43 |
| 5,049,956 | 10/1991 | Yoshida et al. | 357/23.5 |
| 5,055,898 | 10/1991 | Beilstein, Jr. et al. | 357/23.6 |
| 5,057,446 | 10/1991 | Gill et al. | 437/43 |
| 5,071,782 | 12/1991 | Mori | 437/48 |
| 5,077,232 | 12/1991 | Kim et al. | 437/52 |
| 5,141,886 | 8/1992 | Mori | 437/203 |

FOREIGN PATENT DOCUMENTS 0046777 2/1990 Japan.
04-25077 12/1992 Japan.

*Primary Examiner*—Tom Thomas
*Attorney, Agent, or Firm*—Perman & Green

[57] ABSTRACT

A structure and fabrication method for an EEPROM cell having dual channel regions and the floating and control gate folded inside a trench. The cell is built on a SOI film substrate and the bottom part of the floating gate is butted to oxide, which provides high coupling factor. Inside the trench, the floating gates are butted to the conducting channels on two sidewalls, respectively. On the other two sidewalls, the floating gate are butted to the source and drain elements (bit line). These two sidewalls are used as the injection regions of FN tunnelling between source/drain and the floating gate or the isolation regions between bit lines. Since FN tunnelling (program and erase) occurs at the two trench sidewalls against the source and drain, program/erase speed is increased by increasing trench depth while maintaining cell size constant.

5 Claims, 6 Drawing Sheets

METHOD OF MAKING TRENCH EEPROM STRUCTURE ON SOI WITH DUAL CHANNELS

FIELD OF THE INVENTION

The present invention relates to memory cells and, in one form, more particularly, to floating gate memory cells such as the type used in Electrically Erasable Programmable Read Only Memory (EE-PROM) devices.

BACKGROUND OF THE INVENTION

Electrically Erasable Programmable Read Only Memory (EE PROM) cells are flash memory devices that use floating gate and control gate elements in combination with programming and erasing carried out by Fowler-Nordheim tunneling through a thin dielectric.

Performance factors such as program erase and read speed, cell size and operating voltage are important considerations in EEPROM cell designs.

Employing Fowler-Nordheim (FN) tunneling instead of channel hot carrier injection for programming and erasing reduces power consumption and permits a larger number of cells to be programmed at the same time.

EEPROM cells with Fowler-Nordheim tunneling are described in U.S. Pat. No. 5,045,490 issued Sep. 3, 1991 to Esquivel et al. entitled "METHOD OF MAKING A PLEATED FLOATING GATE TRENCH EPROM". This patent teaches an EPROM device and a method of fabricating an EPROM with enhanced capacitive coupling. Trenched memory cells each comprise a pleat-shaped floating gate to increase the coupling ratio with the control gate. As a result higher programming speed and improved cell density may be obtained for a given programming voltage. Formation of bit lines along trench walls result in lower bit lines resistivity for a given cell density.

U.S. Pat. No. 5,071,782 issued Dec. 10, 1991 to Moru entitled "VERTICAL MEMORY CELL ARRAY AND METHOD OF FABRICATION" discloses a vertical memory cell EEPROM array that uses a vertical floating gate memory cell structure that can be fabricated with reduced cell area and channel length. The vertical memory cell memory array includes multiple rows of buried layers that are vertically stacked - a drain bitline over a source groundline, defining a channel layer in between. In each bitline row, trenches of a selected configuration are formed, extending through the drain bitline and channel layer, and at least partially into the source groundline, thereby defining corresponding source, drain and channel regions adjacent each trench. The array can be made contactless, half-contact or full contact, trading decreased access time for increased cell area.

U.S. Pat. No. 5,057,446, issued Oct. 15, 1991, to Gill et al. entitled "METHOD OF MAKING AN EEPROM WITH IMPROVED CAPACITIVE COUPLING BETWEEN CONTROL GATE AND FLOATING GATE" describes an integrated circuit with improved capacitive coupling is provided, and includes a first conductor, a second conductor, and a third conductor. The second conductor and third conductor are disposed adjacent each other, separated by an insulator region. The first conductor contacts the third conductor and extends across a portion of the third conductor. The first and third conductors are separated by an insulator region. A voltage applied to first conductor and second conductor is capacitively coupled to third conductor.

U.S. Pat. No. 5,055,898, issued Oct. 8, 1991 to Beilstein, Jr., et al. entitled "DRAM MEMORY CELL HAVING A HORIZONTAL SOI TRANSFER DEVICE DISPOSED OVER A BURIED STORAGE NODE AND FABRICATION METHODS THEREFOR" discloses semiconductor memory cell, and methods of fabricating same, that includes a substrate and a plurality of trench capacitors formed at least partially within the substrate and dielectrically isolated therefrom. A silicon-on-insulator region includes a silicon layer that overlies an insulator. The silicon layer is differentiated into a plurality of active device regions, each of which is disposed above one of the electrically conductive regions. Each of the active device regions is coupled to an overlying first electrode, or wordline, for forming a gate node of an access transistor, to a second electrode, or bitline, for forming a source node of the access transistor, and to the underlying trench capacitor for forming a drain node of the access transistor. The wordline includes a pair of opposed, electrically insulating vertical sidewalls, and the source node and the drain node of each of the access transistors are each comprised of an electrical conductor disposed upon one of the vertical sidewalls. The array of memory cells further includes structure for coupling the active device regions to the substrate to reduce or eliminate a floating substrate effect.

U.S. Pat. No. 5,049,956 issued Sep. 17, 1991 to Yoshida et al., entitled "MEMORY CELL STRUCTURE OF SEMICONDUCTOR MEMORY DEVICE" discloses a memory of an EPROM wherein a drain region, a channel region, and a source region are formed in a direction perpendicular to the surface of a semiconductor substrate. A trench is provided, which penetrates the drain region and the channel region and reaches the source region. A floating gate and a control gate are formed in the trench, in a direction perpendicular to the surface of the semiconductor substrate.

U.S. Pat. No. 5,077,232 issued Dec. 31, 1991, to Kim et al. entitled "METHOD OF MAKING STACKED CAPACITOR DRAM CELLS" teach a method for manufacturing a combined stack-trench type capacitor includes forming a trench in the semiconductor substrate. A conductive layer, used as a first electrode, a dielectric film and another conductor layer, used as a second electrode, are deposited successively and continuously in the trench. The two conductive layers and the sandwiched dielectric film are then etched to form a capacitor pattern. An insulating layer is formed along the edge of the capacitor pattern, and then a third conductor layer is formed over the entire structure.

Japanese Patent JP 04-25077 issued Jan. 28, 1992 to Nakanishi entitled "SEMICONDUCTOR NONVOLATILE MEMORY" discloses a thick insulating film formed on a semiconductor substrate in a flash type EEPROM memory cell, and a P-type semiconductor element region is formed through the film. N+ type source and drain regions are so provided through the film as to hold the region therebetween. Further, a gate insulating film of a thin silicon oxide film is formed on the region. A floating gate electrode made of polysilicon is provided through the film. Since a SOI substrate is used as the semiconductor substrate, the semiconductor element forming region is electrically independently floated at each memory cell, and hence a substrate current is prevented.

SUMMARY OF THE INVENTION

An EEPROM with FN tunneling normally requires a higher voltage and consequently a large power supply voltage or high coupling factor in order to accelerate electrons across the oxide between the control and floating gates. A high coupling factor can be achieved by scaling down the thickness of the oxide disposed between the control gates and floating gates, or increasing the overlap area between the floating gate and the field oxide. However, scaling down the thickness of the oxide between the control and floating gates degrades the retention time of the EEPROM cells, and increasing the overlap area between the floating gate and field oxide increases the cell size. Finally although increasing the FN tunneling area can improve the program speed and erase speed, it also increases the cell size.

It is an object therefore, of the present invention, to provide an improved EEPROM cell structure and fabrication method therefor, that exhibits high program speed and erase speed without increasing the cell area.

Another object of the present invention is to provide an improved EEPROM cell structure and fabrication method therefor that exhibits a high coupling factor and requires a low operating voltage without increasing the cell area.

Still another object of the present invention is to provide an improved EEPROM cell structure and fabrication method therefor the exhibits a small cell size and high density.

A further object of the present invention is to provide an improved EEPROM cell structure having a cell with dual channels.

BRIEF DESCRIPTION OF THE DRAWINGS

The above set forth and other features of the invention are made more apparent in the ensuing Detailed Description of the Invention when read in conjunction with the attached drawings, wherein.

DETAILED DESCRIPTION OF THE INVENTION

Figure 1:
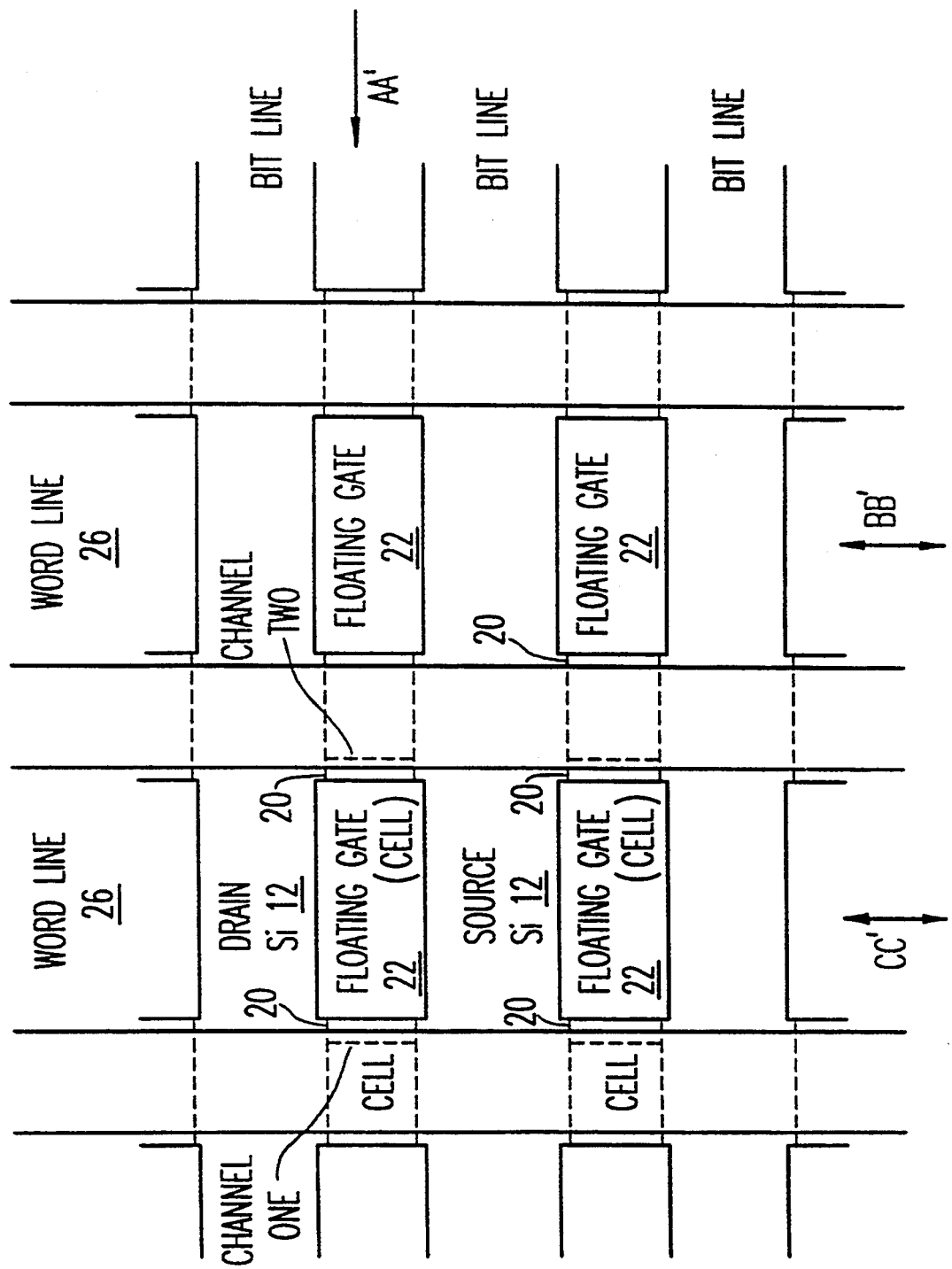
FIG. 1 is a schematic plan view of an EEPROM cell array having dual channel regions and floating gates and control gates according to the principles of the present invention.
Figure 2:
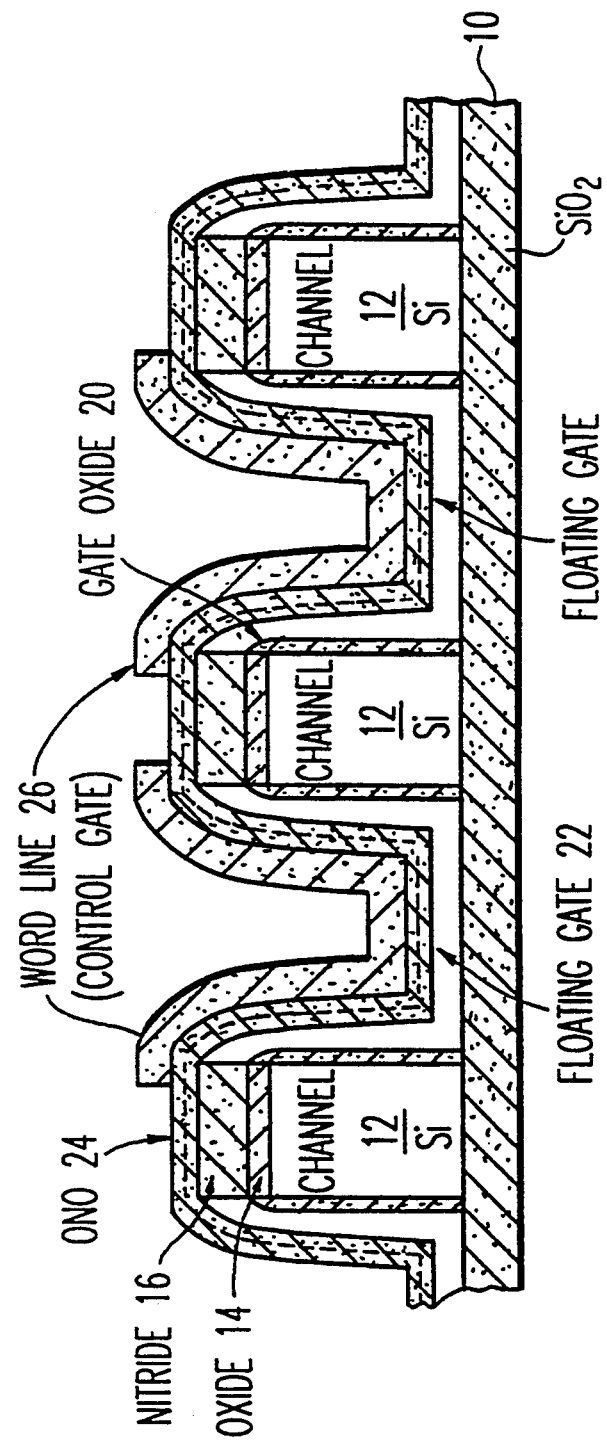
FIG. 2 is a schematic side view taken through a first section of the EEPROM cell array shown in FIG. 1.
Figure 3:
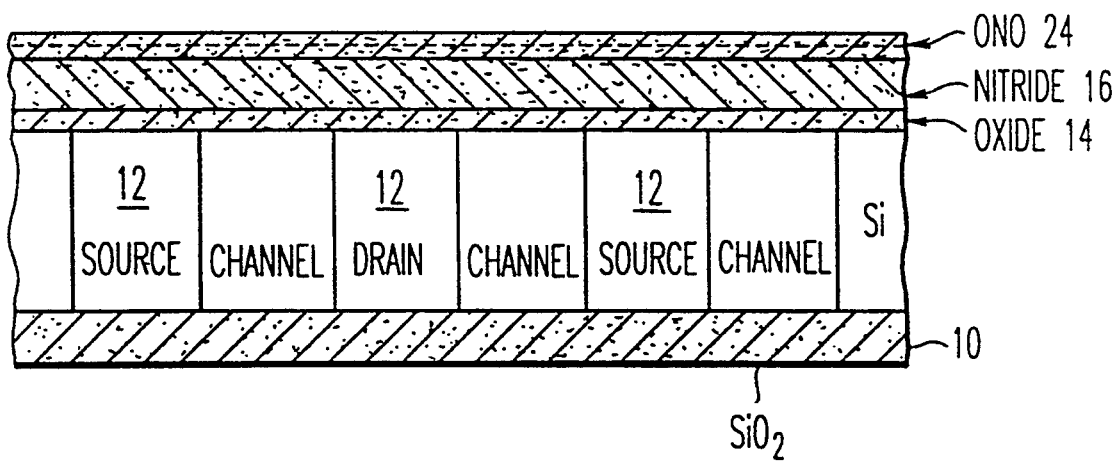
FIG. 3 is a schematic side view taken through a second section of the EEPROM cell array of FIG. 1.
Figure 4:
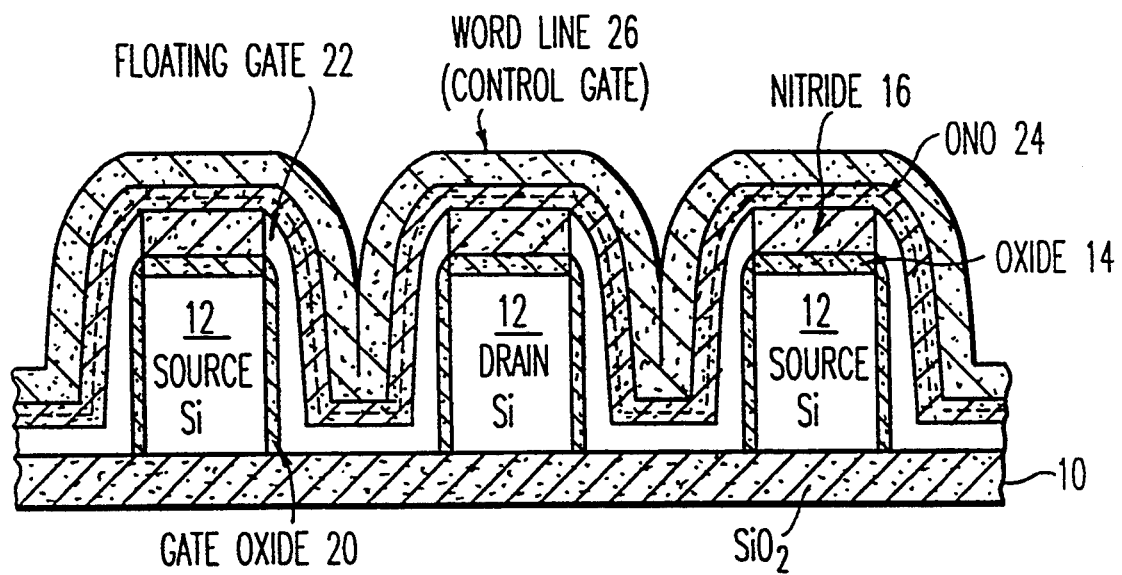
FIG. 4 is a schematic side view taken through a third section of the EEPROM cell array of FIG. 1.

Referring to FIG. 1, a plan view of an EEPROM array is illustrated. Cross-sections taken through AA', BB', and CC' are indicated and are shown in FIGS. 2, 3 and 4, respectively.

Figure 5:
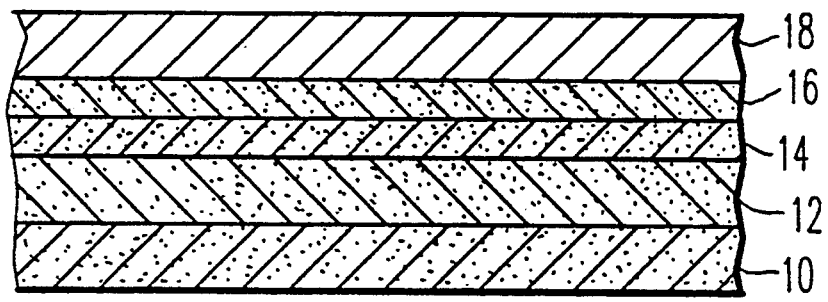
FIGS. 5-11 are schematic side views of the EEPROM cell array of FIG. 1 during various stages of the fabrication process.
Figure 6:
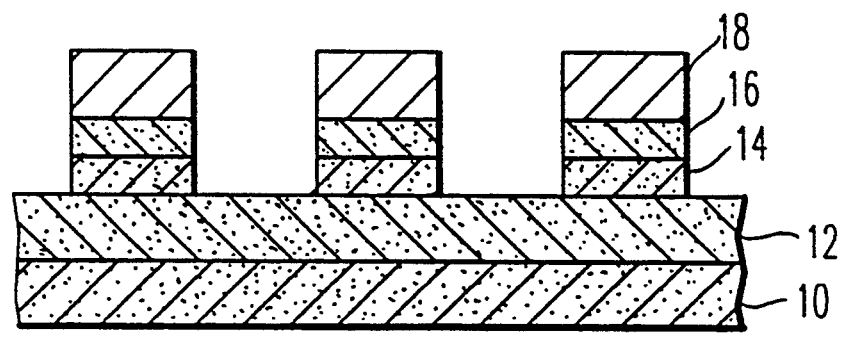
Figure 7:
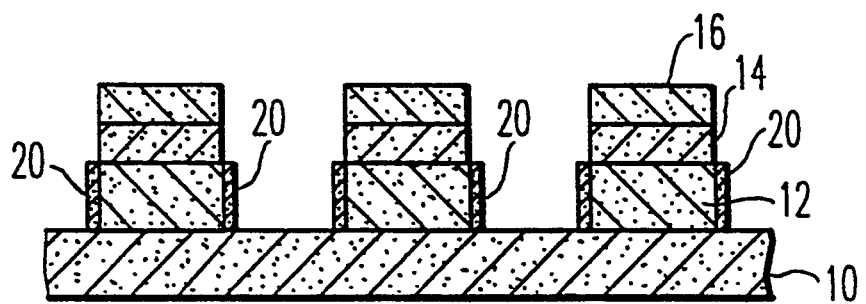

The fabrication steps of the method of the present invention are described relative to FIGS. 5 through 11. In FIG. 5, the process starts with a silicon-on-insulator (SOI) structure including silicon dioxide layer 10 and silicon layer 12. The SOI structure can be made by oxygen implanted in the silicon layer 12 (known as the SIMOX process) or bonded SOI. A layer of silicon dioxide 14, which may be 10 nm thick, is deposited on layer 12 and a layer of nitride 16, which may be 20 nm thick, is deposited on oxide layer 14, for example by LPCVD. Then a layer of photoresist 18 is placed on the nitride layer 16. The photoresist 18 is patterned by a conventional lithographic exposure and removal process and is used as an etch mask. The structure is etched to remove selected portions of the oxide 14 and nitride 16, down to the surface of silicon layer 12 as shown in FIG. 6. The photoresist material 18 is then removed, and using the remaining nitride/oxide layers 16, 14 as a mask, the silicon layer 12 is etched. At this point in the process in the prior art, the etched holes are filled with an isolation oxide. Instead, in the present invention, oxide 20, which may be 7 nm thick is grown on all four sides of the holes as shown in FIG. 7 to provide gate oxide. Oxide 20 may be formed in a furnace at 850 C or by RTA 1,000 C.

Thus the cell is buried in the isolation region. It behaves as a memory cell as well as isolation between the source and drain. This is a key feature that provides high density.

Figure 8:
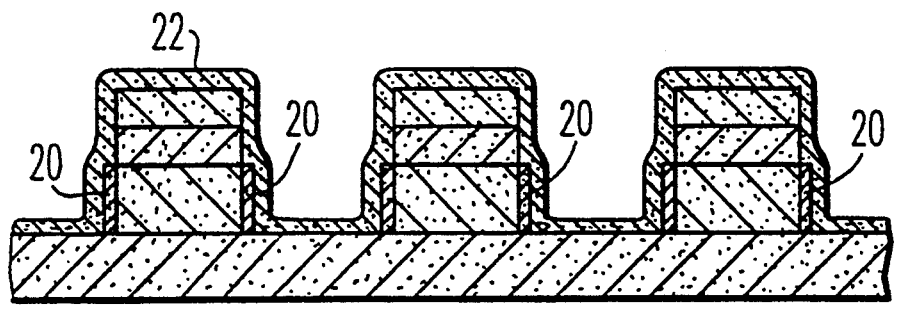

A thin layer of polysilicon 22, for example 1500 Angstroms thick, is deposited over the structure as shown in FIG. 8 and is doped to provide a floating gate.

Figure 9:
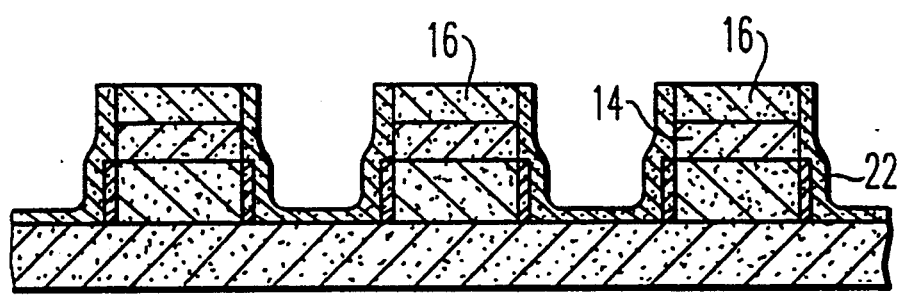
Figure 10:
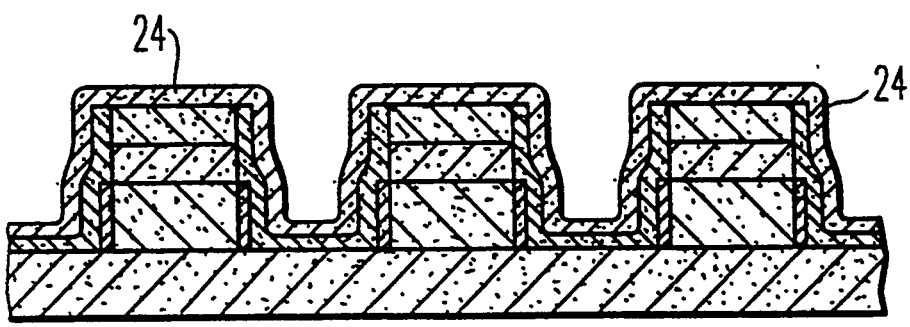

The structure is polished down to the surface of the nitride 16 as shown in FIG. 9 and a layer of oxide/nitride/oxide (ONO) 24 for example 5 nm of $SiO_2$, 10 nm of $Si_3N_4$ and 5 nm of $SiO_2$, is deposited over the structure as illustrated in FIG. 10. It is to be noted that the holes or trenches are self-aligned with the floating gate 22.

A layer of polysilicon 26, for example 1500 Angstroms thick, is then deposited over the ONO layer 24 using a mask to form a wordline as shown in FIG. 2. The usual voltage sources are connected to the structure of FIG. 2 as known in the art to provide an EEPROM device. When the potential is applied to the wordline 26, an active region is created along the vertical sides of the silicon 12 which form the channels.

Figure 11:
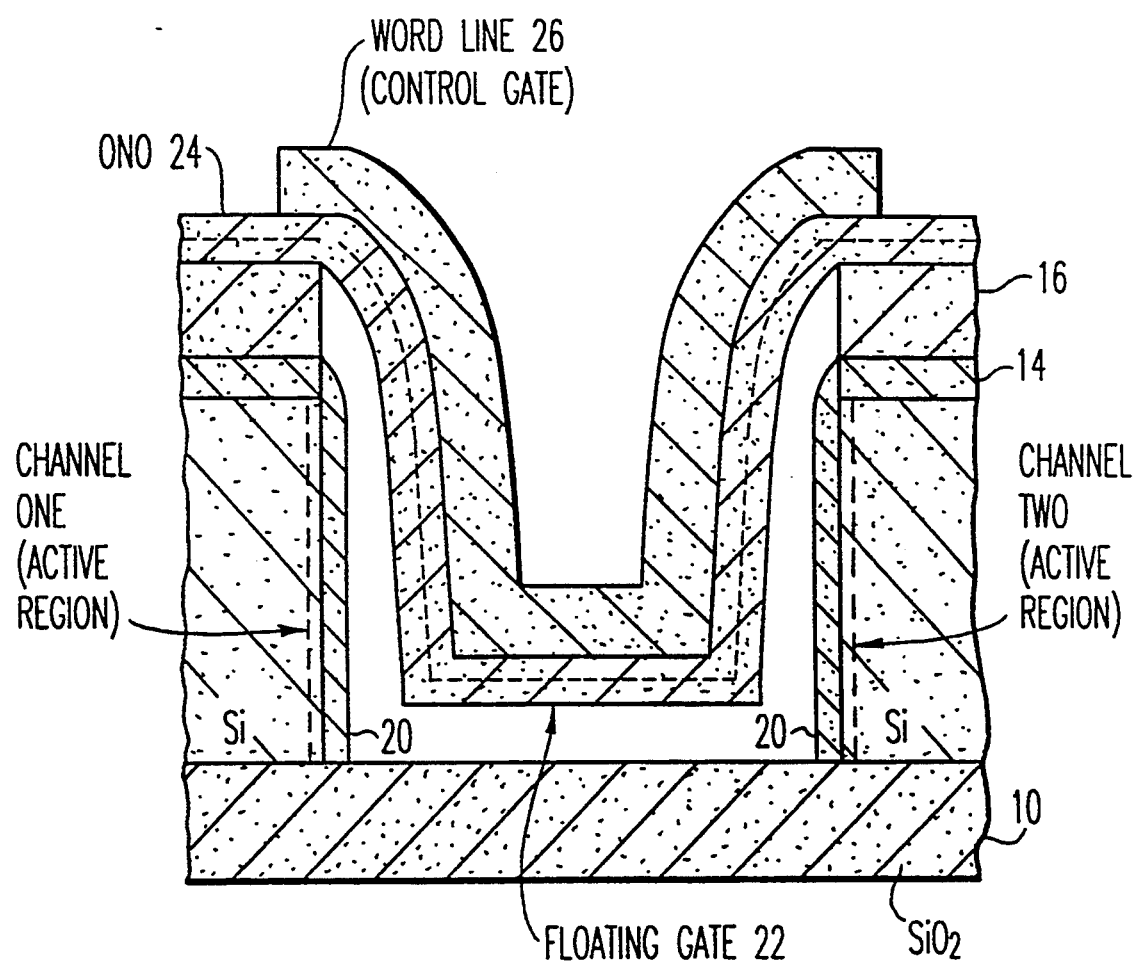

FIG. 11 is a detailed view of a portion of FIG. 2 showing a channel one and a channel two (i.e. dual channel) in one cell with the associated active regions. An important feature is that channel one and channel two are symmetrical and belong to the same cell. This results in twice as much current. In other words the read time (access) and program time is cut in half because both channels are created by the same floating gate 22 folded inside the trench which, in the prior art, is normally filled with isolation oxide and thus there is only one channel as a result.

Referring now to FIG. 3, a view of the structure taken through section BB' is illustrated showing the arrangement of the source and drain elements formed in the silicon material 12 separated by the channel. In FIG. 4, the section CC' is illustrated showing the source and drain elements (bit lines) in silicon 12, the floating gate 22 and control gate 26 (wordline) folded in the trenches and the gate oxide isolation 20 on the walls of the trench that allows the dual channels. The oxide on these two walls (the source and drain) behaves as isolation. On the other two walls (butted to channel) it behaves as gate oxide.

The present invention, as illustrated, provides isolation by the oxide on the four sides of the trench, while still providing space for the floating gate 22 and the control gate (wordline) 26. In the transistor structure illustrated in FIG. 11, the voltage difference between the source and drain elements (bit line) results in current flow (perpendicular to the plane of the drawing) from source to drain that does not fill the entire channel. When the transistor is on, both active regions are "on" because they are symmetrical due to one floating gate, and the oxide on the walls of the trench provide isolation that prevent shorts.

What has been described is a new structure and novel fabrication method for an EEPROM cell having dual channel regions and the floating and control gate folded inside a trench. Since the cell is built on SOI film, a key feature is that the bottom part of the floating gate is butted to oxide, which provides high coupling factor. Inside the trench, the floating gates are butted to the conducting channels on two sidewalls, respectively. On the other two sidewalls, the floating gate are butted to the source and drain elements (bit line). These two sidewalls can be used as the injection regions of FN tunnelling between source/drain and the floating gate or the isolation regions between bit lines.

The cell proposed overcomes the problems mentioned above by having the following novel features. The feature of high program/erase speed and high read speed. Since FN tunnelling (program and erase) occurs at the two trench sidewalls against the source and drain, program/read/erase speed can be increased by increasing trench depth while maintaining cell size constant. Even if channel hot carrier injection is used as program mechanism, the speed is improved because carriers can inject from two trench sidewalls against channel regions (dual channels).

The feature of high coupling factor and low operating voltage. For constant size, the coupling factor between control gate and floating gate can be increased by simply increasing trench size (area) because the bottom of the floating gate are butted to isolation oxide. As a result of high coupling factor, power supply voltage can be reduced.

The feature of small cell size. High density is achieved by folding the control gate and floating gate into a trench. Also, the floating gate is self-aligned to trench because it is defined by the chemical and mechanical polish process. Furthermore, the conventional source/drain isolation region (trench) has been used instead to form a high density cell. The invention provides a feature of fast access time because, while reading the information stored in the floating gate, about two times current can be detected because the floating gate will turn on both channels on the sidewalls. It implies that access time will be shorter.

Although the described EEPROM structure provides significant advantages when FN tunnelling is used for program and erase, the present invention can also be used with channel, hot carrier injection.

While the invention has been particularly shown and described with respect to a preferred embodiment thereof, it will be understood by those skilled in the art that changes in form and details may be made therein without departing from the scope and spirit of the invention.

We claim:

1. A fabrication method for a trench memory structure including memory cells having dual channels comprising the steps of:

step 1, depositing a layer of silicon dioxide on silicon-on-insulator substrate consisting of a layer of silicon on a layer of insulation, step 2, depositing a layer of nitride on said layer of silicone dioxide deposited in step 1, step 3, removing selected portions and leaving remaining portions of said nitride and silicon dioxide layers on said silicon-on-insulator substrate, step 4, removing selected portions and leaving remaining portions of said silicon layer of said silicon-on-insulator substrate to form trenches having four vertical sides between said remaining portions of said silicon layer in the areas where said selected portions of said nitride and silicon dioxide layers were removed in step 3, said remaining portions of said silicon layer providing source and drain regions on either of two opposite sides of said trenches, step 5, growing oxide on the four vertical sides of said remaining portions of silicon layer to provide gate oxide regions, step 6, forming a doped polysilicon layer over said trenches to provide floating gate regions in said trenches, step 7, depositing a layer of insulating material over said doped polysilicon layer and a layer of polysilicon over said layer of insulating material to provide wordline regions.

2. A fabrication method for a trench memory structure according to claim 1 wherein said step 4 includes the steps of:

step 4A, first depositing a layer of insulating material on the silicon layer of said silicon-on-insulator substrate, step 4B, removing selected portions and leaving remaining portions of said layer of insulating material deposited on said silicon-on-insulator substrate in step 1A, step 4C, and then removing said selected portions and leaving remaining portions of said silicon layer of said silicon-on-insulator substrate to form said trenches in the areas where said selected portions of said nitride and silicon dioxide layers were removed in step 1B.

3. A fabrication method for a trench memory structure according to claim 2 wherein said layer of insulating material deposited in step 4A includes a layer of silicon dioxide on said silicon-on-insulator substrate and a layer of nitride disposed on said layer of silicon dioxide.

4. A fabrication method for a trench memory structure according to claim 3 wherein said step 4B includes the steps of forming a photoresist etch mask pattern on said nitride layer and etching away said selected portions of said nitride and silicon dioxide layers through said patterned photoresist etch mask.

5. A fabrication method for a trench memory structure according to claim 4 wherein said step 4C includes the step of removing said patterned photoresist etch mask and, using said remaining portions of said nitride and silicon dioxide layers as an etch mask and etching away said selected portions of said silicon layer of said SOI substrate to form said trenches.

* * * * *